United States Patent
Chang

(10) Patent No.: US 9,680,479 B1
(45) Date of Patent: Jun. 13, 2017

(54) ELECTRONIC APPARATUS AND CONTROLLING METHOD

(71) Applicant: Realtek Semiconductor Corporation, Hsinchu (TW)

(72) Inventor: Che-Wei Chang, Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/093,756

(22) Filed: Apr. 8, 2016

(30) Foreign Application Priority Data

Jan. 14, 2016 (TW) .............................. 105101123 A

(51) Int. Cl.
*H03L 1/00* (2006.01)
*H03L 1/02* (2006.01)
*H03B 5/12* (2006.01)
*H03B 5/04* (2006.01)

(52) U.S. Cl.
CPC .............. *H03L 1/023* (2013.01); *H03B 5/04* (2013.01); *H03B 5/124* (2013.01); *H03B 5/1243* (2013.01); *H03B 5/1253* (2013.01); *H03L 1/026* (2013.01); *H03B 2200/004* (2013.01)

(58) Field of Classification Search
CPC ... H03L 7/00; H03L 7/104; H03L 1/00; H03L 1/02; H03L 1/023; H03L 2207/06; H03L 1/026; H03L 7/099; H03L 1/025; H03L 1/04; H03B 5/1228; H03B 5/1253; H03B 5/32; H03B 5/1212; H03B 5/1215; H03B 5/1243; H03B 5/30; H03B 17/00; H03B 19/00; H03B 1/00; H03B 2200/0038; H03B 2200/005; H03B 5/124; H03B 2200/004; H03B 5/04

USPC ........................ 331/176, 177 V, 167, 117 FE
See application file for complete search history.

(56) References Cited

U.S. PATENT DOCUMENTS

| 7,005,936 B2 * | 2/2006 | Tanzawa ................. H03C 3/08 331/17 |
| 8,022,780 B2 | 9/2011 | Taghivand et al. |
| 8,466,750 B2 | 6/2013 | Chiu et al. |
| 8,493,114 B2 | 7/2013 | Cho et al. |

OTHER PUBLICATIONS

Behzad Saeidi et al, "A Wide-Range VCO with Optimum Temperature Adaptive Tuning," Radio Frequency Integrated Circuits Symposium (RFIC), IEEE, 2010.

(Continued)

*Primary Examiner* — Arnold Kinkead
(74) *Attorney, Agent, or Firm* — CKC & PARTNERS CO., LTD.

(57) ABSTRACT

An electronic apparatus includes a voltage-controlled oscillator and a biasing circuit. The voltage-controlled oscillator includes varactors. The voltage-controlled oscillator is configured to output an oscillating frequency at a first temperature. The biasing circuit electrically coupled with the varactors is configured to provide a first biasing voltage to the varactors at the first temperature, and provide a second biasing voltage to the varactors at a second temperature, in which the varactors have a first temperature coefficient, and the biasing circuit generates the first biasing voltage and the second biasing voltage according to values of the first temperature coefficient and a second temperature coefficient.

17 Claims, 6 Drawing Sheets

(56) References Cited

OTHER PUBLICATIONS

Yang You et al, "A 12GHz 67% Tuning Range 0.37pS RJrms PLL with LC-VCO Temperature Compensation Scheme in 0.13μm CMOS," IEEE Radio Frequency Integrated Circuits Symposium, 2014.

Hiroshi Akima et al, "A 10 GHz Frequency-Drift Temperature Compensated LC VCO with Fast-Settling Low-Noise Voltage Regulator in 0.13 μm CMOS," IEEE, 2010.

Lan-Chou Cho et al, "A 1.22/6.7 ppm/° C. VCO with frequency-drifting compensator in 60 nm CMOS," IEEE Asian Solid-State Circuits Conference, Nov. 14-16, 2011 / Jeju, Korea.

Julien Mira et al, "Distributed MOS Varactor Biasing for VCO Gain Equalization in 0/13μm CMOS Technology," IEEE Radio Frequency Integrated Circuits Symposium, 2004.

* cited by examiner

ELECTRONIC APPARATUS AND CONTROLLING METHOD

RELATED APPLICATIONS

This application claims priority to Taiwan Application Serial Number 105101123, filed Jan. 14, 2016, which is herein incorporated by reference.

BACKGROUND

Field of Invention

The present disclosure relates to an electronic apparatus and a control method, and, particularly, to an electronic apparatus and a control method that having an oscillating frequency that is not affected by the temperature.

Description of Related Art

The communication systems and microprocessors nowadays often use phase-locked loop circuits to provide stable high frequencies. As a result, phase-locked loop circuits are widely used in electronic products such as digital televisions and communication chips.

In general, phase-locked loop circuits include a coarse-tune circuit block and a fine-tune circuit block. At first, the coarse-tune circuit block controls a digital controlled capacitor array (DCCA) based on digital signals to vary a capacitance of a LC resonant cavity so as to select an appropriate frequency band firstly. After the frequency band is selected, varactors in the fine-tune circuit block is used to vary the capacitance of the LC resonant cavity to stabilize the loop and precisely output the target oscillating frequency.

However, the capacitance of the varactors in the fine-tune circuit block changes along with the temperature and affects the oscillating frequency outputted by the phase-locked loop circuits at the same time. As a result, when the variation of the oscillating frequency exceeds the variable range of the fine-tune circuit block, the phase-locked loop can not be stable and loses lock.

For such a phenomenon, additional varactors are often disposed in the phase-locked loop circuit such that the variation of the capacitance of these additional varactors affected by the temperature and the variation of the capacitance of the original varactors in the fine-tune circuit block affected by the temperature cancel each out. By using such a technique, the offset of the oscillating frequency due to the variation of the temperature is lowered. However, the additional varactors increase the capacitance of the system at the same time. The decrease of the variable range of the fine-tune circuit block is unavoidable. Further, the additional varactors also introduce new paths of noise and interference.

DETAILED DESCRIPTION

As used herein, the terms "coupled" and "connected" may refer to two or more elements are in direct physical contact or make electrical contact with each other for indirect physical contact or electrical contact, or via a wireless connection, while "coupled" and "connected" may also refer to two or more elements are in the operations or actions.

Figure 1:
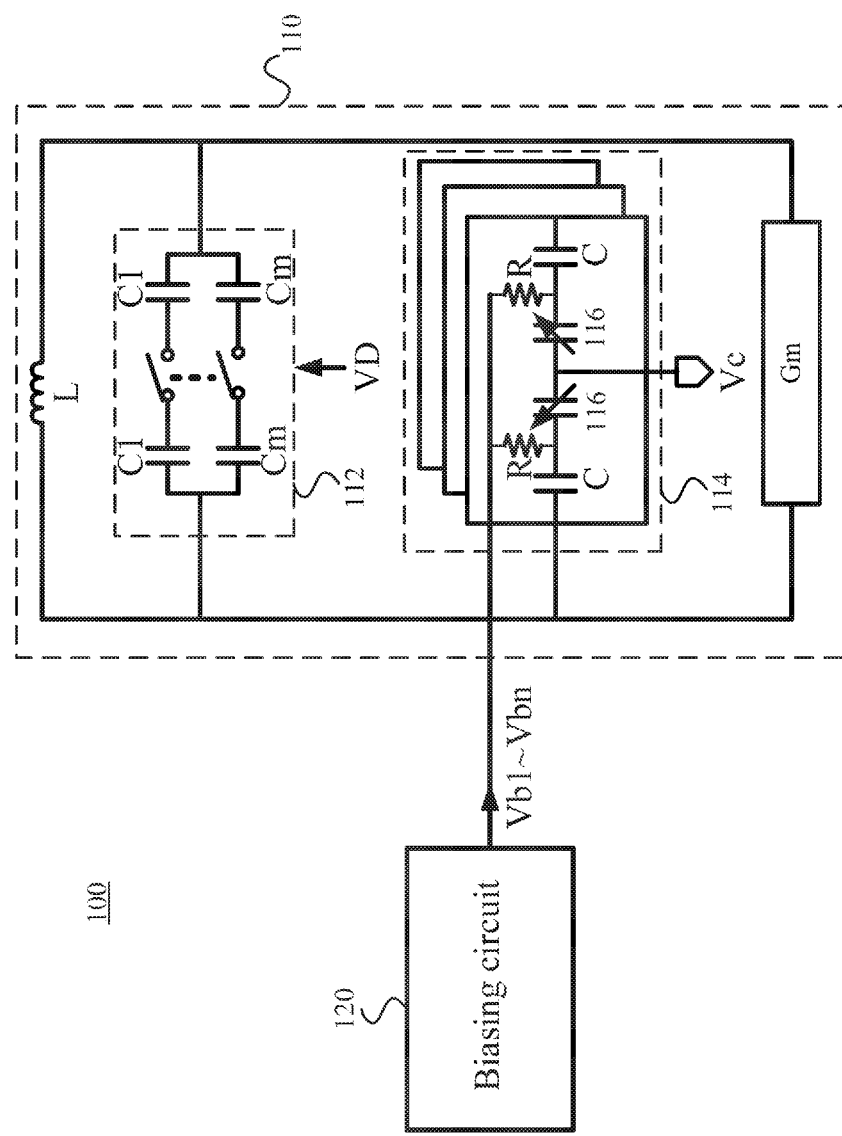
FIG. 1 is a block diagram of an electronic apparatus in an embodiment of the disclosure.

Referring to FIG. 1, a block diagram of an electronic apparatus 100 is illustrated. The electronic apparatus 100 may be used in a phase-locked loop circuit and includes a voltage-controlled oscillator 110 and a biasing circuit 120. The electronic apparatus 100 may be a digital television, a communication chip or any electronic device that includes a voltage-controlled oscillator.

The voltage-controlled oscillator 110 includes an inductor L, a fixed capacitor array 112, a variable capacitor array 114 and an amplifier Gm. In general, the voltage-controlled oscillator 110 generates resonance by using passive components, i.e., the inductor L, the fixed capacitor array 112 and the capacitors in the variable capacitor array 114, and compensates the energy loss due to the resonance of the passive components by using an active circuit, i.e., the amplifier Gm, in which the gain of the amplifier Gm may be a positive value or a negative value depends on different applications. It is appreciated that the voltage-controlled oscillator 110 illustrated in FIG. 1 is merely an embodiment. In practical applications, the voltage-controlled oscillator 110 may be used in an analog phase-locked loop (APLL), a digital phase-locked loop (DPLL), an all-digital phase-locked loop (ADPLL) or any phase-locked loop circuit that includes a voltage-controlled oscillator.

The fixed capacitor array 112 is coupled to the inductor L and is configured to control coarse variable capacitors C1. Further, in the present embodiment, a plurality of coarse variable capacitors C1~Cm in the fixed capacitor array 112 can be selectively conducted or disconnected based on a group of digital signals VD to vary an equivalent capacitance of the fixed capacitor array 112 so as to further adjust an oscillating frequency f of the voltage-controlled oscillator 110. The oscillating frequency f can be expressed by equation (1) as follows:

$$f = \frac{1}{2\pi\sqrt{L_f C_f}} \qquad \text{equation (1)}$$

In equation (1), $L_f$ is the inductance of the inductor L, and $C_f$ is the equivalent capacitance of the voltage-controlled oscillator 110. As illustrated in FIG. 1, in general, in addition to the coarse variable capacitors C1 of the fixed capacitor array 112, the variable capacitor array 114 of the voltage-controlled oscillator 110 includes varactors 116. As a result, in equation (1), $C_f$ is the equivalent capacitance of all the capacitors in the voltage-controlled oscillator 110. In addition, in some embodiments, the digital signals VD can include two or more than two groups of digital signals.

For example, when a row of the coarse variable capacitors C1 in the fixed capacitor array 112 are conducted based on the digital signals VD, the oscillating frequency f of the voltage-controlled oscillator 110 becomes 5.5 GHz. When two rows of the coarse variable capacitors C1~C2 in the fixed capacitor array 112 are conducted based on the digital signals VD, the oscillating frequency f of the voltage-controlled oscillator 110 becomes 5 GHz. Moreover, when three rows of the coarse variable capacitors C1~C3 in the fixed capacitor array 112 are conducted based on the digital signals VD, the oscillating frequency f of the voltage-controlled oscillator 110 becomes 4.5 GHz. The frequencies of 4.5 GHz, 5 GHz and 5.5 GHz are exemplarily described herein. In practical applications, any frequency is possible. As described above, when each of the configurations of the fixed capacitor array 112 is selectively formed, a frequency gap (e.g., 0.5 GHz) exists between each two of the neighboring oscillating frequencies. In other words, the voltage-controlled oscillator 110 can select an appropriate frequency band by using the fixed capacitor array 112. For example, the conduction of one row of the coarse variable capacitors C1 of the fixed capacitor array 112 based on the digital signals VD is equivalent to the selection of the frequency band of 5.5 GHz~5 GHz.

The variable capacitor array 114 includes the varactors 116. When an appropriate frequency band is selected by the fixed capacitor array 112, the oscillating frequency is fine-tuned by using the control signal Vc to control the varactors 116 in the variable capacitor array 114 so as to precisely output the target oscillating frequency f of the voltage-controlled oscillator 110. In the present embodiment, the oscillating frequency f is expressed by an equation (2) as follows:

$$f = f_0 + K \cdot Vc \qquad \text{equation (2)}$$

In equation (2), $f_0$ is the coarse-tuned oscillating frequency obtained when the fixed capacitor array 112 is coupled to the coarse variable capacitors C1, in which K is an oscillating constant and Vc is the control signal.

Figure 2:
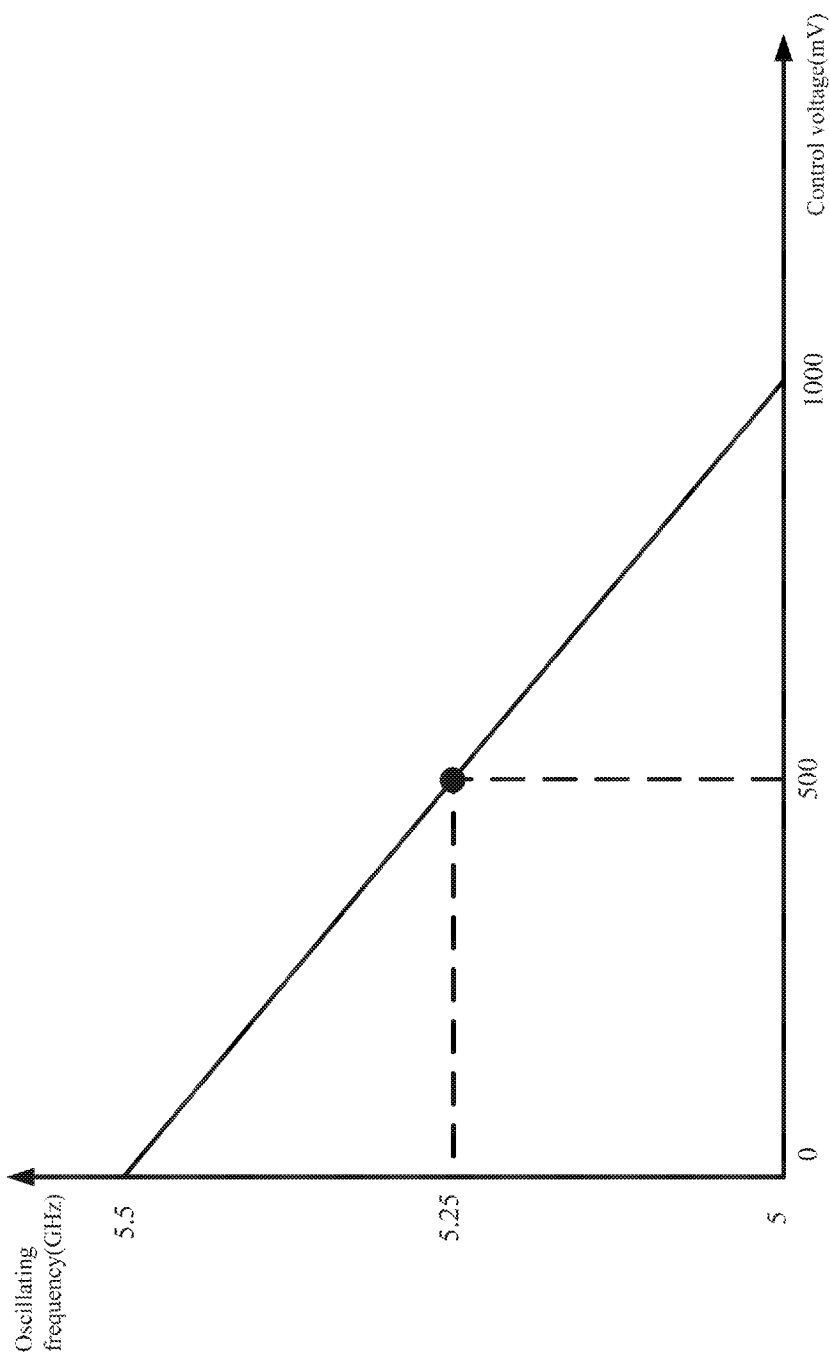
FIG. 2 is a diagram illustrating the correspondence between the control signal and the oscillating frequency in an embodiment of the disclosure.

Furthermore, referring to both FIG. 1 and FIG. 2, FIG. 2 is a diagram illustrating the correspondence between the control signal Vc and the oscillating frequency f. It is appreciated that in the embodiment of FIG. 2, since a voltage of a node B of the backplane of the varactors 116 is a fixed value (i.e., the voltage of the node B is not driven by the biasing circuit 120), and the oscillating constant K is a negative value, the oscillating frequency f is decreased along with the increase of the voltage of the control signal Vc as shown in the equation (2). In addition, the coarse oscillating frequency $f_0$ can be such as 5.5 GHz, which is equivalent to the condition of the oscillating frequency f corresponding to the control signal Vc having the value 0. When the control signal Vc gradually increases, such as from 0 volt to 1 volt, the oscillating frequency can be adjusted from 5.5 GHz to 5 GHz. The numerical corresponding relation between the oscillating frequency f and the control signal Vc is exemplarily described herein. In practical applications, any value is possible.

In some embodiments, the oscillating constant K can be a positive value. In other words, the oscillating frequency f increases along with the increase of the voltage of the control signal Vc.

It is appreciated that the oscillating constant K is mainly affected by the characteristic of the material of the varactors 116. For example, when the varactors 116 have a positive first temperature coefficient A1, the capacitance of the varactors 116 increases along with the increase of the temperature, and the oscillating constant K decreases accordingly. On the other hand, when the varactors 116 have a negative first temperature coefficient A1, the capacitance of the varactors 116 decreases along with the increase of the temperature and the oscillating constant K increases accordingly.

Figure 3:
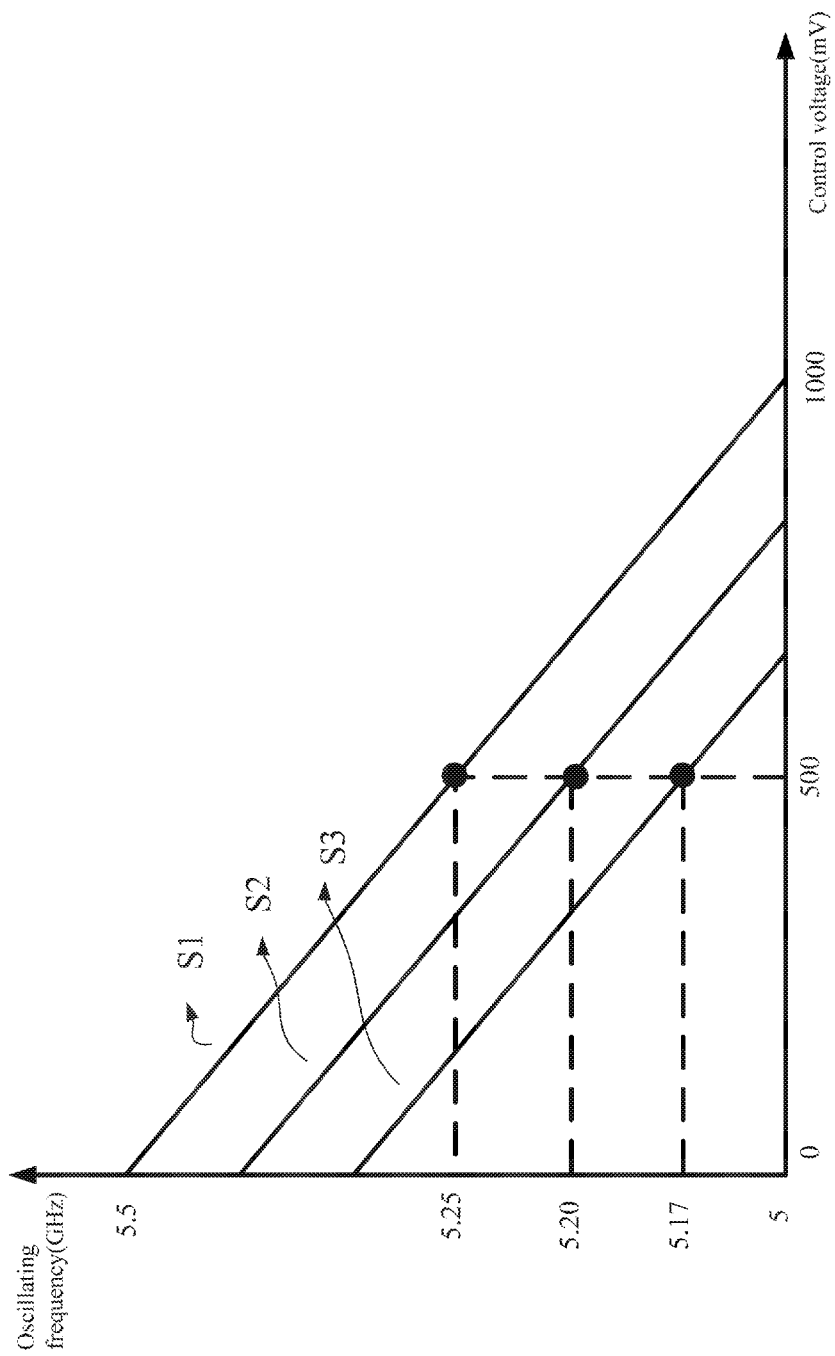
FIG. 3 is a diagram illustrating the correspondence between the control signal and the oscillating frequency in an embodiment of the disclosure.

Moreover, referring to FIG. 3, a diagram illustrating the correspondence between the control signal Vc and the oscillating frequency f. Curves S1, S2 and S3 illustrate the diagrams of the correspondence between the control signal Vc and the oscillating frequency f under the temperatures of −40° C., 42.5° C. and 125° C. respectively. As shown in the diagram, along with the process of the temperature increases from −40° C. to 125° C., since the varactors 116 have the positive first temperature coefficient A1, the capacitance of the varactors 116 increases along with the increase of the temperature such that the corresponding relation between the oscillating f and the control signal Vc gradually shifts from the curve S1 to the curve S2 and further from the curve S2 to the curve S3.

According to the equation (2), the shifting phenomenon is generated due to the decrease of the coarse oscillating frequency $f_0$ of the fixed capacitor array 112. However, such a shifting phenomenon makes the voltage-controlled oscillator 110 unable to precisely output the target oscillating frequency f. For example, under the condition of the temperature of −40° C., when the control signal Vc is 500 mV, the voltage-controlled oscillator 110 outputs the oscillating frequency f of about 5.25 GHz. However, under the condition that the control signal Vc is unchanged, when the temperature gradually increases to 125° C., the voltage-controlled oscillator 110 outputs the oscillating frequency f of about 5.17 GHz. Further, it is shown that the oscillating frequency f of 5.5 GHz can be outputted under the temperature of −40° C. However, under the condition of the temperature of 125° C., the oscillating frequency f of 5.5 GHz can not be outputted.

Referring back to FIG. 1, in this embodiment, the biasing circuit 120 is electrically coupled with the varactors 116, and the biasing circuit 120 is configured to provide first biasing voltages Vb1~Vbn to the varactors 116 at the first temperature and to provide second biasing voltages Vb1'~Vbn' (not illustrated) to the varactors 116 at a second temperature, such that the equivalent capacitance of the voltage-controlled oscillator 110 is not changed. In other words, under the respective conditions of the first temperature and the second temperature, the biasing circuit 120 can make the voltage-controlled oscillator 110 output the same (or about the same) oscillating frequency f under the same control voltage Vc.

Moreover, in some embodiments, the biasing voltages outputted by the biasing circuit 120 are outputted to the node B of the backplane of the varactors 116 to vary the capacitance of the varactors 116 such that the equivalent capacitance of the voltage-controlled oscillator 110 is not changed. As a result, the voltage-controlled oscillator 110 outputs the same oscillating frequency f under the same control voltage Vc.

For example, the first temperature can exemplarily be −40° C., the second temperature can exemplarily be 125° C., the first biasing voltage can exemplarily be 0.3V, and the second biasing voltage can exemplarily be 0.5V. In some embodiments, for example, when the first temperature coefficient A1 of the varactors 116 is positive, the first biasing voltage can be smaller than the second biasing voltage. When the temperature changes from −40° C. to 125° C., as described above, since the first temperature coefficient A1 of the varactors 116 is a positive temperature coefficient, the capacitance of the varactors 116 gradually increases. The increasing amount is a first biasing amount. On the other hand, when the biasing voltage received by the varactors 116 changes from 0.3V to 0.5V, since the voltage difference between the biasing voltages Vb1~Vbn and the control signal Vc increases, the capacitance of the varactors 116 gradually decreases. The decreasing amount is a second biasing amount. In the present embodiment, the first biasing amount and the second biasing amount mentioned above cancel each out. In other words, when the temperature changes from −40° C. to 125° C., the increasing amount and the decreasing amount of the capacitance of the varactors 116 cancel each out to keep the capacitance of the voltage-controlled oscillator 110 unchanged.

Figure 4:
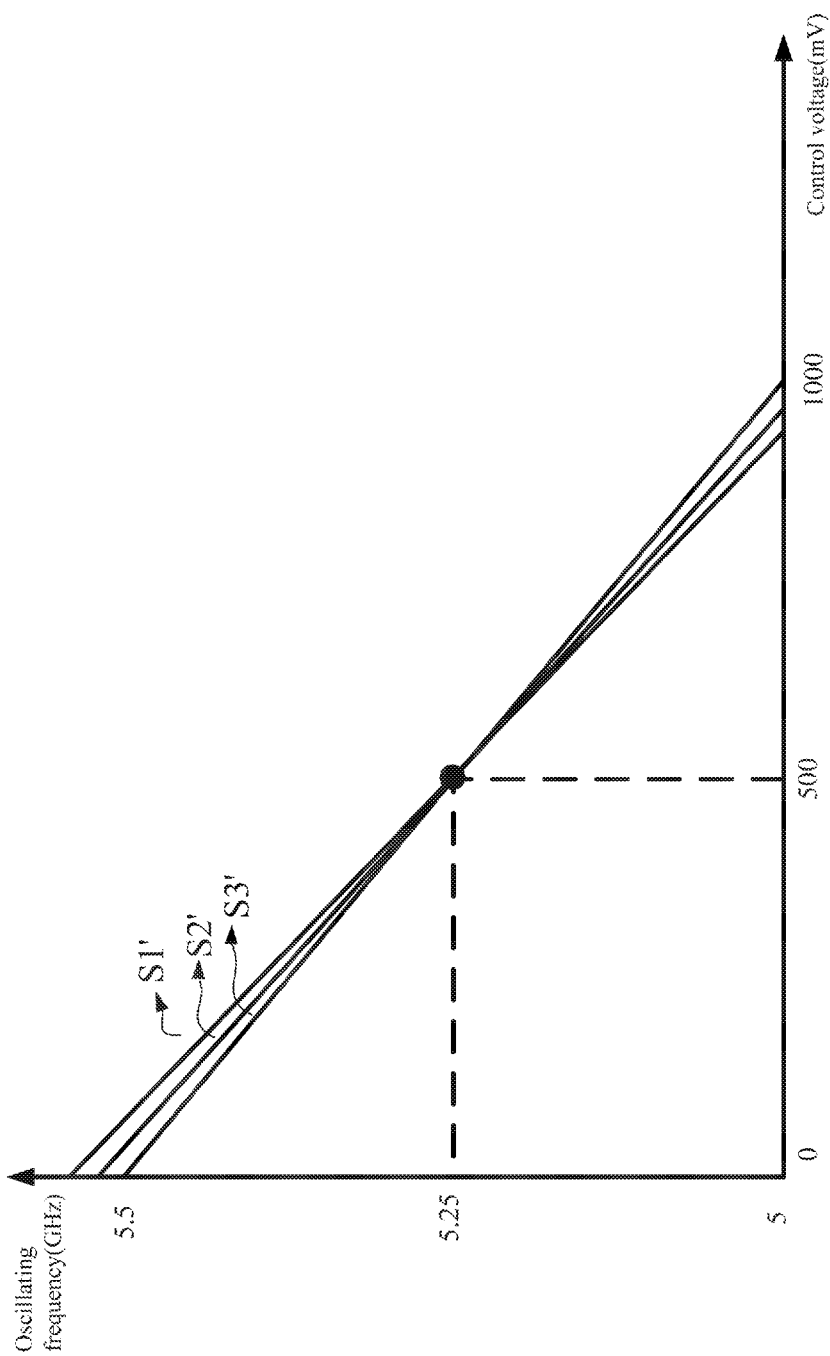
FIG. 4 is a diagram illustrating the correspondence between the control signal and the oscillating frequency in an embodiment of the disclosure.

Referring also to FIG. 4, a diagram illustrating the correspondence between the control signal Vc and the oscillating frequency f is presented. Curves St, S2' and S3' illustrate the diagrams of the correspondence between the control signal Vc and the oscillating frequency f under the temperatures of −40° C., 42.5° C. and 125° C. respectively. As shown in the diagram, along with the process of the temperature increases from −40° C. to 125° C., though the capacitance of the varactors 116 increases along with the increase of the temperature, the curves S1', S2' and S3' almost overlap since the biasing voltage received by the varactors 116 gradually increases at the same time. Especially under the designated oscillating frequency (i.e., 5.25 GHz), the oscillating frequency is kept the same under different temperature without the need to vary the voltage of the control signal Vc. In other words, the oscillating frequency f outputted by the voltage-controlled oscillator 110 is not affected by the temperature. By using the biasing circuit 120 to provide different biasing voltage to the varactors 116 of the variable capacitor array 114 under different temperatures, the target oscillating frequency f outputted by the voltage-controlled oscillator 110 is not affected by the temperature.

Figure 5:
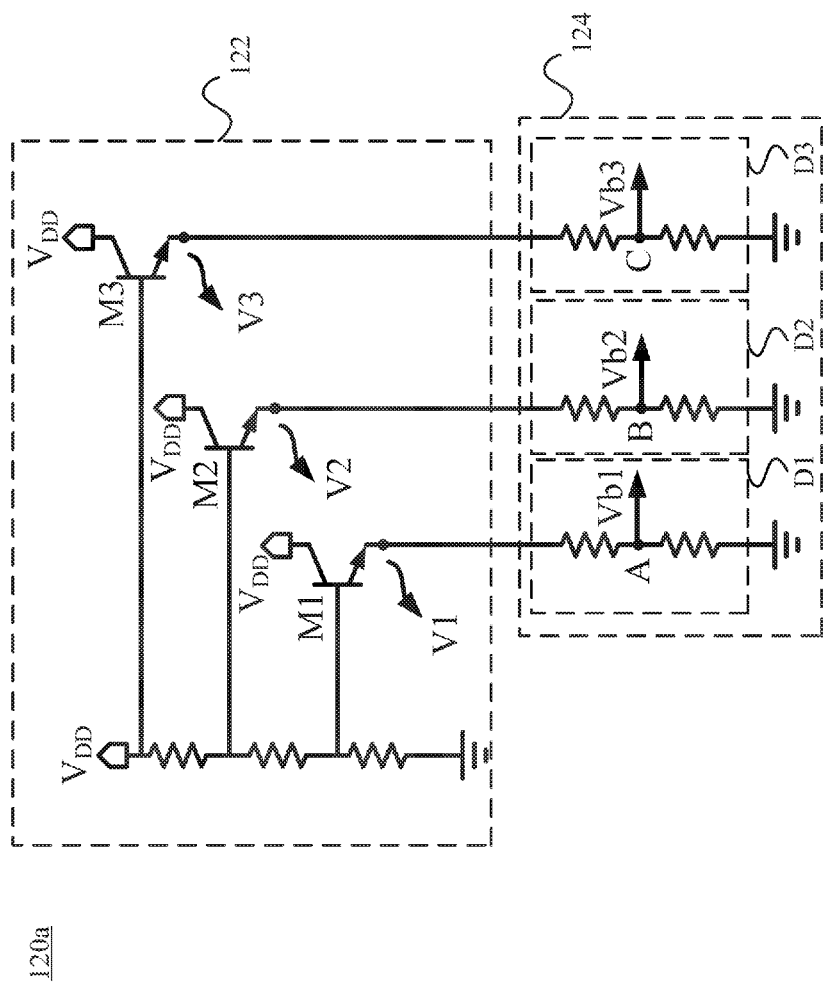
FIG. 5 is a diagram of a biasing circuit in an embodiment of the disclosure.

Referring to FIG. 5, a diagram of a biasing circuit is illustrated. The biasing circuit 120a is only an embodiment of the biasing circuit 120 in FIG. 1. The biasing circuit 120a includes a temperature coefficient generator 122 and a voltage regulator 124. In the present embodiment, the temperature coefficient generator 122 includes bipolar junction transistors M1~M3 and the voltage regulator 124 includes voltage-dividing circuits D1~D3 coupled to an output port of the bipolar junction transistors M1~M3 respectively. The temperature coefficient generator 122 has a second temperature coefficient A2. The second temperature coefficient 122 outputs initial biasing signals V1~V3 according the second temperature coefficient A2. In the present embodiment, the value of the second temperature coefficient A2 is larger than the value of the first temperature coefficient A1.

The voltage regulator 124 is coupled to the temperature coefficient generator 122 and is configured to divide the initial biasing signals V1~V3 to generate the first biasing voltages Vb1~Vb3 at the first temperature (the voltages of the terminals A, B and C at the first temperature) and generate the second biasing voltages Vb1'~Vb3' at the second temperature (not illustrated, the voltages of the terminals A, B and C at the second temperature). It is appreciated that in some embodiments, the temperature coefficient generator 122 is not limited to include the bipolar junction transistors. The temperature coefficient generator 122 can be any semiconductor device including diodes or other electronic devices that has the temperature coefficient.

For example, the first temperature and the second temperature can exemplarily be −40° C. and 125° C. respectively. The second temperature coefficient A2 is from the turn-on voltage of the bipolar junction transistors M1~M3 that varies along with the change of the temperature. The bipolar junction transistors M1~M3 are npn-type bipolar junction transistors. The turn-on voltage between the base and the emitter decreases along with the increase of the temperature, i.e., the second temperature coefficient A2 is a negative value. As a result, the initial biasing signals V1~V3 increases along with the increase of the temperature. It is appreciated that the absolute value of the second temperature coefficient A2 is larger than the value of the first temperature coefficient A1. For example, the second temperature coefficient A2 can be ~2 unit/° C. The first temperature coefficient A1 can be +1 unit/° C. The absolute value of the second temperature coefficient A2, which is 2 unit/° C., is larger than the value of the first temperature coefficient A1, which is 1 unit/° C. As described above, since the absolute value of the second temperature coefficient A2 is larger than the absolute value of the first temperature coefficient A1, the variation of the temperature coefficient generator 122 along with the change of the temperature is larger than that of the varactors 116. As a result, attenuating the initial biasing signals V1~V3 by the voltage-dividing circuits D1~D3 is necessary to generate the first biasing voltages Vb1~Vb3 at the first temperature (−40° C.). Since the initial biasing voltages V1~V3 increases along with the increase of the temperature, the first biasing voltages Vb1~Vb3 thus increase along with the increase of the temperature to generate the second biasing voltages Vb1'~Vb3' (125° C.). As a result, the biasing circuit 120 provides different biasing voltages to the varactors 116 of the variable capacitor array 114 under different temperatures to keep the capacitance of the varactors 116 unchanged.

In addition, in some embodiments, the absolute value of the second temperature coefficient A2 is smaller than the value of the first temperature coefficient A1. Under such a condition, a configuration of the voltage regulator 124 for elevating the initial biasing signals is used instead of the configuration mentioned above. For example, the second temperature coefficient A2 can be ~1 unit/° C. The first temperature coefficient A1 can be +2 unit/° C. The absolute value of the second temperature coefficient A2, which is 1 unit/° C., is smaller than the absolute value of the first temperature coefficient A1, which is 2 unit/° C. As described above, since the value of the second temperature coefficient A2 is smaller than the value of the first temperature coefficient A1 in the present embodiment, the variation of the temperature coefficient generator 122 along with the change of the temperature is smaller than that of the varactors 116. As a result, the voltage regulator 124 is not limited to include the voltage-dividing circuits. The voltage regulator 124 may include a voltage amplifier or may be other electronic devices that can amplify the signals.

Figure 6:
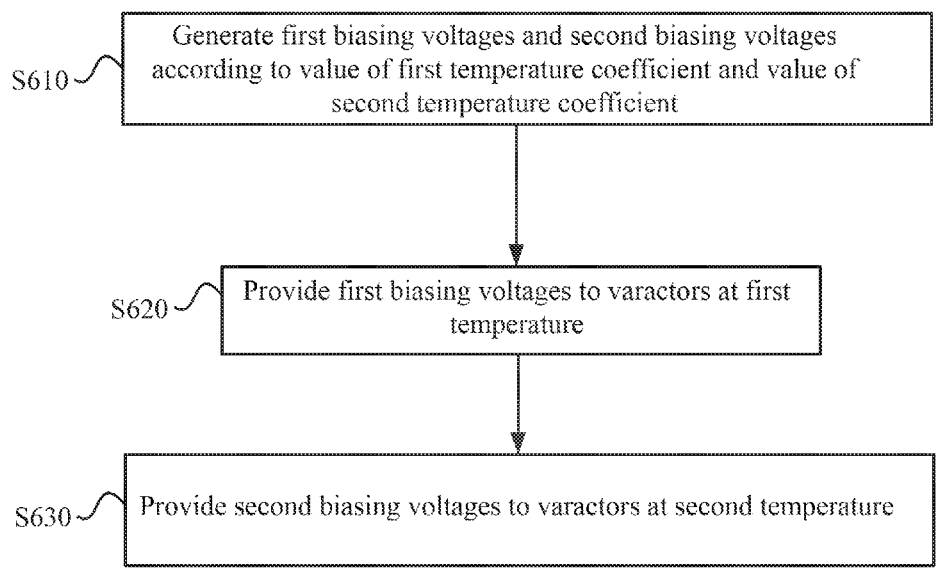
FIG. 6 is a diagram of a control method in an embodiment of the disclosure.

Referring to FIG. 6, a diagram of a control method 600 is illustrated. The control method 600 in the present embodiment can be adapted to the electronic device 100 in the embodiments described above. However, the present disclosure is not limited thereto.

In step S610, the first biasing voltages Vb1~Vbn and the second biasing voltages Vb1'~Vbn' are generated according to the value of the first temperature coefficient A1 and the value of the second temperature coefficient A2.

In step S620, the first biasing voltages Vb1~Vbn are provided to the varactors 116 at the first temperature.

In step S630, the second biasing voltages Vb1'~Vbn' are provided to the varactors 116 at the second temperature such that the total capacitance of the voltage-controlled oscillator 110 is unchanged so as to further output the oscillating frequency f.

In some embodiments, the control method 600 further includes a step S640 (not illustrated) to output the initial biasing signals V1~V3 according to the second temperature coefficient A2, wherein the value of the second temperature coefficient A2 is larger than the value of the first temperature coefficient A1. Subsequently, a step S650 (not illustrated) is performed to attenuate the initial biasing signals V1~V3, and to generate the first biasing voltages Vb1~Vbn at the first temperature and generate the second biasing voltages Vb1'~Vbn' at the second temperature.

In some embodiments, the control method 600 further includes a step S640' (not illustrated) to output the initial biasing signals V1~V3 according to the second temperature coefficient A2, wherein the value of the second temperature coefficient A2 is smaller than the value of the first temperature coefficient A1. Subsequently, a step S650' (not illustrated) is performed to elevate the initial biasing signals V1~V3, and to generate the first biasing voltages Vb1~Vbn at the first temperature and generate the second biasing voltages Vb1'~Vbn' at the second temperature.

In summary, different biasing voltages are provided under different temperatures by the biasing circuit to the varactors of the voltage-controlled oscillator to keep the capacitance of the varactors unchanged. The target oscillating frequency outputted by the voltage-controlled oscillator is thus not affected by the temperature to avoid the occurrence of the shifting of the oscillating frequency.

Although the present disclosure has been described in considerable detail with reference to certain embodiments thereof, other embodiments are possible. Therefore, the spirit and scope of the appended claims should not be limited to the description of the embodiments contained herein.

What is claimed is:

1. An electronic apparatus comprising:
   a voltage-controlled oscillator, comprising at least one varactor and configured to output an oscillating frequency at a first temperature; and
   a biasing circuit, electrically coupled with the at least one varactor and configured to provide at least one first biasing voltage to the at least one varactor at the first temperature, and to provide at least one second biasing voltage to the at least one varactor at a second temperature, in which the at least one varactor has a first temperature coefficient, and the biasing circuit generates the at least one first biasing voltage and the at least one second biasing voltage according to values of the first temperature coefficient and a second temperature coefficient;
   wherein when the temperature changes from the first temperature to the second temperature, a capacitance of the varactor has a first biasing amount, when a bias voltage received by the varactor changes from the first bias voltage to the second bias voltage, the capacitance of the varactor has a second biasing amount, and the first biasing amount and the second biasing amount cancel each other out.

2. The electronic apparatus of claim 1, wherein the biasing circuit comprises:
   a temperature coefficient generator, having the second temperature coefficient, wherein the value of the second temperature coefficient is larger than the value of the first temperature coefficient, and the temperature coefficient generator outputs at least one initial biasing signal according the second temperature coefficient; and
   a voltage regulator coupled to the temperature coefficient generator and configured to attenuate the at least one initial biasing signal, and to generate the at least one first biasing voltage at the first temperature and generate the at least one second biasing voltage at the second temperature.

3. The electronic apparatus of claim 1, wherein the biasing circuit comprises:
   a temperature coefficient generator having the second temperature coefficient, wherein the value of the second temperature coefficient is smaller than the value of the first temperature coefficient, and the temperature coefficient generator outputs at least one initial biasing signal according the second temperature coefficient; and
   a voltage regulator coupled to the temperature coefficient generator and configured to elevate the at least one initial biasing signal, and to generate the at least one first biasing voltage at the first temperature and generate the at least one second biasing voltage at the second temperature.

4. The electronic apparatus of claim 2, wherein the temperature coefficient generator comprises at least one bipolar junction transistor, and the voltage regulator comprises at least one voltage-dividing circuit coupled to an output port of the bipolar junction transistor respectively.

5. The electronic apparatus of claim 1, wherein the voltage-controlled oscillator further comprises an inductor and a fixed capacitor array coupled to the inductor and configured to control a coarse variable capacitor.

6. The electronic apparatus of claim 5, wherein the voltage-controlled oscillator further comprises an amplifier configured to compensate an energy loss of the varactor, the inductor and the fixed capacitor.

7. The electronic apparatus of claim 5, wherein the coarse variable capacitor is configured to coarse-tune an equivalent capacitance of the voltage-controlled oscillator, and the varactor is configured to fine-tune the equivalent capacitance of the voltage-controlled oscillator.

8. An electronic apparatus comprising:
   a voltage-controlled oscillator comprising:
      an inductor;
      a fixed capacitor array coupled to the inductor and configured to control a coarse variable capacitor; and
      a variable capacitor array comprising at least one varactor, wherein the voltage-controlled oscillator is configured to output an oscillating frequency at a first temperature; and
   a biasing circuit electrically coupled with the at least one varactor and configured to provide at least one first biasing voltage to the at least one varactor at the first temperature, and to provide at least one second biasing voltage to the at least one varactor at a second temperature, in which the at least one varactor has a first temperature coefficient, and the biasing circuit generates the at least one first biasing voltage and the at least one second biasing voltage according to values of the first temperature coefficient and a second temperature coefficient;
   wherein when the temperature changes from the first temperature to the second temperature, a capacitance of the varactor has a first biasing amount, when a bias voltage received by the varactor changes from the first bias voltage to the second bias voltage, the capacitance of the varactor has a second biasing amount, and the first biasing amount and the second biasing amount cancel each other out.

9. The electronic apparatus of claim 8, wherein the biasing circuit comprises:

a temperature coefficient generator having the second temperature coefficient, wherein the value of the second temperature coefficient is larger than the value of the first temperature coefficient, and the temperature coefficient generator outputs at least one initial biasing signal according the second temperature coefficient; and a voltage regulator coupled to the temperature coefficient generator and configured to attenuate the at least one initial biasing signal, and to generate the at least one first biasing voltage at the first temperature and generate the at least one second biasing voltage at the second temperature.

10. The electronic apparatus of claim 8, wherein the biasing circuit comprises:

a temperature coefficient generator having the second temperature coefficient, wherein the value of the second temperature coefficient is smaller than the value of the first temperature coefficient, and the temperature coefficient generator outputs at least one initial biasing signal according the second temperature coefficient; and a voltage regulator coupled to the temperature coefficient generator and configured to elevate the at least one initial biasing signal, and to generate the at least one first biasing voltage at the first temperature and generate the at least one second biasing voltage at the second temperature.

11. The electronic apparatus of claim 9, wherein the temperature coefficient generator comprises at least one bipolar junction transistor, and the voltage regulator comprises at least one voltage-dividing circuit coupled to an output port of the bipolar junction transistor respectively.

12. The electronic apparatus of claim 8, wherein the voltage-controlled oscillator further comprises an amplifier configured to compensate an energy loss of the varactor, the inductor and the fixed capacitor.

13. The electronic apparatus of claim 8, wherein the coarse variable capacitor is configured to coarse-tune an equivalent capacitance of the voltage-controlled oscillator, and the varactor is configured to fine-tune the equivalent capacitance of the voltage-controlled oscillator.

14. A control method to control a voltage-controlled oscillator that comprises at least one varactor and configured to output an oscillating frequency at a first temperature and the at least one varactor has a first temperature coefficient, wherein the control method comprises:

generating at least one first biasing voltage and at least one second biasing voltage according to values of the first temperature coefficient and a second temperature coefficient;

providing at least one first biasing voltage to the at least one varactor at the first temperature; and providing at least one second biasing voltage to the at least one varactor at a second temperature;

wherein when the temperature changes from the first temperature to the second temperature, a capacitance of the varactor has a first biasing amount, when a bias voltage received by the varactor changes from the first bias voltage to the second bias voltage, the capacitance of the varactor has a second biasing amount, and the first biasing amount and the second biasing amount cancel each other out.

15. The control method of claim 14, further comprising:

outputting at least one initial biasing signal according the second temperature coefficient, wherein the absolute value of the second temperature coefficient is larger than the value of the first temperature coefficient; and attenuating the at least one initial biasing signal, generating the at least one first biasing voltage at the first temperature and generating the at least one second biasing voltage at the second temperature.

16. The control method of claim 14, further comprising:

outputting at least one initial biasing signal according the second temperature coefficient, wherein the absolute value of the second temperature coefficient is smaller than the value of the first temperature coefficient; and elevating the at least one initial biasing signal, generating the at least one first biasing voltage at the first temperature and generating the at least one second biasing voltage at the second temperature.

17. The control method of claim 14, wherein the voltage-controlled oscillator further comprises an inductor and a fixed capacitor array coupled to the inductor and configured to control a coarse variable capacitor, the control method further comprises:

coarse-tuning an equivalent capacitance of the voltage-controlled oscillator by the coarse variable capacitor; and fine-tuning the equivalent capacitance of the voltage-controlled oscillator by the varactor.

* * * * *